United States Patent
Hassner et al.

(10) Patent No.: US 6,195,025 B1
(45) Date of Patent: Feb. 27, 2001

(54) METHOD AND MEANS FOR INVERTIBLY MAPPING BINARY SEQUENCES INTO RATE 2/3 (1,K) RUN-LENGTH-LIMITED CODED SEQUENCES WITH MAXIMUM TRANSITION DENSITY CONSTRAINTS

(75) Inventors: Martin Aureliano Hassner, Mountain View; Nyles Heise, San Jose, both of CA (US); Walter Hirt, Wettswil (CH); Barry Marshall Trager, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/115,530

(22) Filed: Jul. 13, 1998

(51) Int. Cl.[7] ....................................... H03M 7/00
(52) U.S. Cl. ............................... 341/59; 341/58; 341/61
(58) Field of Search ..................... 341/59, 58, 61

(56) References Cited

U.S. PATENT DOCUMENTS

| | | | |
|---|---|---|---|
| 4,413,251 | 11/1983 | Adler et al. | 341/59 |
| 4,675,650 | * 6/1987 | Coppersmith et al. | 340/347 |
| 5,175,545 | 12/1992 | Uchiyama et al. | 341/59 |
| 5,604,497 | * 2/1997 | Sonntag | 341/59 |
| 5,731,768 | * 3/1998 | Tsang | 341/59 |
| 5,742,243 | * 4/1998 | Moriyama et al. | 341/59 |
| 5,774,078 | * 6/1998 | Tanaka et al. | 341/68 |
| 5,859,601 | * 1/1999 | Moon et al. | 341/59 |
| 5,995,543 | * 11/1999 | Kovacs et al. | 375/230 |

OTHER PUBLICATIONS

Moon, J. et al.: "Maximum Transition Run Codes for Data Storage Systems", 1996 Digests of Intermag: IEEE International Magnetics Conference, Seattle, Apr. 9–12, 1996, p. HB–10.

* cited by examiner

Primary Examiner—Brian Young
Assistant Examiner—Jason L. W. Kost
(74) Attorney, Agent, or Firm—R. Bruce Brodie; Marc D. McSwain

(57) ABSTRACT

A method and means for reducing high-duty-cycle unconstrained binary signal sequences in storage and communications processes and systems by invertibly mapping such sequences into a (1, k) rate ⅔ RLL codestream constrained to a duty cycle substantially approximating one-third. That is, binary sequences ordinarily mapping into high-duty-cycle RLL-code sequences are either inhibited from repeating indefinitely or excluded.

8 Claims, 12 Drawing Sheets

(1,9 or 1,13) RLL RATE 2/3 CODER FOR LOW DUTY CYCLE IN DATA STORAGE OR TRANSMISSION (1,9 or 1,13) RLL RATE 2/3 CODER FOR LOW DUTY CYCLE
IN DATA STORAGE OR TRANSMISSION

| Next State/Internal Output N = $(n_1 n_2 n_3)$/C = $(c_1 c_2 c_3)$ | | | | | | | |
|---|---|---|---|---|---|---|---|
| Internal Inputs $b_1 b_2 b_3 b_4$     x = don't care bit value | | | | | | | |
| Internal State $S = s_1 s_2 s_3$ | 00xx | 01xx | 10xx | 1100 | 1101 | 1110 | 1111 |
| 000 | 000/010 | 001/010 | 010/010 | 111/010 | 111/001 | 011/010 | 011/010 |
| 001 | 000/001 | 001/001 | 100/001 | 100/010 | 100/010 | 100/010 | 100/010 |
| 010 | 000/100 | 001/100 | 010/100 | 011/100 | 011/100 | 011/100 | 011/100 |
| 011 | 000/101 | 001/101 | 100/101 | 100/100 | 100/100 | 100/100 | 100/100 |
| 100 | 000/000 | 001/000 | 010/000 | 011/000 | 011/000 | 011/000 | 011/000 |
| 111 | 100/000 | 100/000 | 100/000 | 100/000 | 100/000 | 100/000 | 100/000 |

FINITE STATE TRANSITION TABLE FOR
LOW DUTY CYCLE (1,9) RATE 2/3 RLL ENCODER

*FIG. 4A*

NEXT STATE BOOLEAN FUNCTION $n_1 = b_1 s_3 + b_1 b_2 \grave{}b_3 \grave{}s_1 \grave{}s_2 + s_1 s_3$ $n_2 = b_1 \grave{}s_3$ $n_3 = b_2 \grave{}s_3 + \grave{}s_1 b_1 b_2$

OUTPUT BOOLEAN FUNCTION $c_1 = \grave{}s_1 s_2$ $c_2 = \grave{}s_1 s_2 \grave{}c_3$ $c_3 = \grave{}s_1 s_3 (\grave{}b_1 + \grave{}b_2) + \grave{}s_1 \grave{}s_2 \grave{}s_3 b_1 b_2 b_3 b_4$

EQUATIONS DEFINING (1,9) RATE 2/3 RLL ENCODER

*FIG. 4B*

| R = $(r_1r_2r_3)$ | $(r_4r_5r_6)$ | $(r_7r_8r_9)$ | Decoded Output |
|---|---|---|---|
| 010 | `(000) | ......... | 00 |
| 001 | `(000) | ......... | 01 |
| 100 | `(000) | ......... | 10 |
| 101 | `(000) | ......... | 11 |
| 010 | 000 | `(000) | 0111 |
| 001 | 000 | `(000) | 0110 |
| 100 | 000 | `(000) | 1111 |
| 101 | 000 | `(000) | 1110 |
| 010 | 000 | 000 | 001100 |
| 001 | 000 | 000 | 001101 |

DECODING TABLE FOR THE LOAD DUTY CYCLE (1,9) RATE 2/3 RLL DECODER

FIG. 5A

INTERNAL VARIABLES $z_1 = \,\hat{}(r_1 + r_2 + r_3); z_2 = \,\hat{}(r_4 + r_5 + r_6); z_3 = \,\hat{}(r_7 + r_8 + r_9)$

LOGIC EQUATIONS FOR THE DECODED OUTPUT $U_1 = r_1$
$U_2 = (\,\hat{}z_2)r_3 + \,\hat{}z_1 z_2 z_3$
$U_3 = \,\hat{}z_1 z_2$
$U_4 = z_2 z_3 + \,\hat{}z_1 z_2 \,\hat{}r_3$
$U_5 = 0$
$U_6 = z_2 z_3 r_3$

EQUATIONS DEFINING (1,9) RATE 2/3 RLL DECODER

FIG. 5B

LOGIC FOR LOW DUTY CYCLE (1,9) RATE 2/3 RLL
STATE INDEPENDENT LOOK AHEAD DECODER

DEFINE THE FOLLOWING VECTORS:

DATA INPUT: $\quad D = (d_1, d_2)$

PRESENT STATE: $\quad S = (s_1, s_2, s_3)$

NEXT STATE: $\quad N = (n_1, n_2, n_3)$

INTERNAL DATA: $\quad B^1 = (B^1_1, B^1_2) = (b_1, b_2)$ $$B^2 = (B^2_1, B^2_2) = (b_3, b_4)$$

$$B^3 = (B^3_1, B^3_2) = (b_5, b_6)$$

INTERNAL CODEWORD: $\quad C = (c_1, c_2, c_3)$

ENCODER OUPUT: $\quad Y = (y_1, y_2, y_3)$

THE COMPONENTS OF N AND C ARE COMPUTED IN TERMS OF THE COMPONENTS OF S, $B^1$, $B^2$, AND $B^3$, WITH THE FOLLOWING BOOLEAN EXPRESSIONS:

$$n_1 = (s_1 s_3) + (s_3 b_1) + (\overline{s_1} b_1 b_2 \overline{b_3}) + (\overline{s_1} b_1 b_2 \overline{b_4} b_5 b_6),$$

$$n_2 = (\overline{s_3} b_1) + (s_1 s_2 b_1 \overline{b_2}),$$

$$n_3 = (\overline{s_3} b_2) + (\overline{s_1} \overline{b_1} b_2) + (s_1 s_2 b_1 \overline{b_2}),$$

$$c_1 = \overline{s_1} s_2,$$

$$c_2 = \overline{s_1} \overline{s_2} \overline{c_3},$$

$$c_3 = \overline{s_1} s_3 (\overline{b_1} + \overline{b_2}) + \overline{s_1} s_3 b_1 b_2 \overline{b_3} b_4.$$

THE VECTORS, $B^1$, $B^2$, $B^3$, S, AND Y, ARE OUTPUTS OF LATCHES; THEY ARE UPDATED AS FOLLOWS:

$$B^1 \leftarrow B^2 \leftarrow B^3 \leftarrow D,$$

$$S \leftarrow N, \text{ AND } Y \leftarrow C.$$

EQUATIONS DEFINING LOW DUTY CYCLE (1, 13) RATE 2/3 ENCODER

*FIG. 6A*

| Internal State $S = (S_1S_2S_3)$ | Internal Inputs ($b_1$ $b_2$ $b_3$ $b_4$ $b_5$ $b_6$)    X = don't care bit value | | | | | | | |
|---|---|---|---|---|---|---|---|---|
| | Next State/Internal Output N = ($n_1$ $n_2$ $n_3$)/C = ($c_1$ $c_2$ $c_3$) | | | | | | | |
| | 00XXXX | 01XXXX | 10XXXX | 1100XX | 1101XX | 111011 | 1110'(11) | 1111XX |
| 000 | 000/010 | 001/010 | 010/010 | 111/010 | 111/001 | 111/010 | 011/010 | 011/010 |
| 001 | 000/001 | 001/001 | 100/001 | 100/010 | 100/010 | 100/010 | 100/010 | 100/010 |
| 010 | 000/100 | 001/100 | 010/100 | 111/100 | 111/101 | 111/100 | 011/100 | 011/100 |
| 011 | 000/101 | 001/101 | 100/101 | 100/100 | 100/100 | 100/100 | 100/100 | 100/100 |
| 100 | 000/000 | 001/000 | 010/000 | 011/000 | 011/000 | 011/000 | 011/000 | 011/000 |
| 111 | 100/000 | 100/000 | 111/000 | 100/000 | 100/000 | 100/000 | 100/000 | 100/000 |

FINITE STATE TRANSITION TABLE FOR
LOW DUTY CYCLE (1,13) RATE 2/3 RLL ENCODER

*FIG. 6B*

| R = $(r_1 r_2 r_3)$ | $(r_4 r_5 r_6)$ | $(r_7 r_8 r_9)$ | $(r_{10} r_{11} r_{12})$ | Decoded Output |
|---|---|---|---|---|
| 010 | `(000) | | | 00 |
| 001 | `(000) | | | 01 |
| 100 | `(000) | | | 10 |
| 101 | `(000) | | | 11 |
| 010 | 000 | `(000) | | 0111 |
| 001 | 000 | `(000) | | 0110 |
| 100 | 000 | `(000) | | 1111 |
| 101 | 000 | `(000) | | 1110 |
| 010 | 000 | 000 | `(000) | 001100 |
| 001 | 000 | 000 | `(000) | 001101 |
| 100 | 000 | 000 | `(000) | 101100 |
| 101 | 000 | 000 | `(000) | 101101 |
| 010 | 000 | 000 | 000 | 00111011 |
| 100 | 000 | 000 | 000 | 10111011 |

DECODING TABLE FOR THE LOAD DUTY CYCLE (1,13) RATE 2/3 RLL DECODER

*FIG. 7A*

DEFINE THE VECTORS:

RECEIVED CODEWORD: $R = (r_1, r_2, r_3)$,

INTERNAL CODEWORDS:
$Y^4 = (y_{10}, y_{11}, y_{12})$,
$Y^3 = (y_7, y_8, y_9)$,
$Y^2 = (y_4, y_5, y_6)$,
$Y^1 = (y_1, y_2, y_3)$,

INTERNAL VARIABLES:
$Z_B = \overline{y_4 + y_5 + y_6}$,
$Z_C = \overline{y_7 + y_8 + y_9}$,
$Z_D = \overline{y_{10} + y_{11} + y_{12}}$,
$X^1 = (X_1^1, X_2^1) = (x_1, x_2)$,
$X^2 = (X_1^2, X_2^2) = (x_3, x_4)$,
$X^3 = (X_1^3, X_2^3) = (x_5, x_6)$,
$U = (u_1, u_2)$,
$V = (v_1, v_2)$,
$W = (w_1, w_2)$.

EQUATIONS DEFINING (1,13) RATE 2/3 RLL DECODER

THE COMPONENTS OF $X^1$, $X^2$, AND $X^3$ ARE COMPUTED WITH THE FOLLOWING BOOLEAN EXPRESSIONS:

$x_1 = v_1$,
$x_2 = (y_6 \overline{Z_C}) + (\overline{Z_B} Z_C \overline{Z_D}) + v_2$,
$x_3 = (Z_B Z_C Z_D) + (\overline{Z_B} Z_C) + w_1 + w_2$,
$x_4 = (Z_B Z_C \overline{Z_D} y_3) + [\overline{Z_B} Z_C (Z_D + \overline{y_6})] + w_2$,
$x_5 = y_{10}$,
$x_6 = Z_B Z_C Z_D$.

THE VECTORS $Y^1$, $Y^2$, $Y^3$, $Y^4$, U, V, AND W, ARE OUTPUTS OF LATCHES; THEY ARE UPDATED AS FOLLOW:

$Y^1 \leftarrow Y^2 \leftarrow Y^3 \leftarrow Y^4 \leftarrow R$,
$W \leftarrow X^3, V \leftarrow X^2, U \leftarrow X^1$.

WHERE U REPRESENTS THE DECODED DATA BITS.

FIG. 7B

250
METHOD AND MEANS FOR INVERTIBLY MAPPING BINARY SEQUENCES INTO RATE 2/3 (1,K) RUN-LENGTH-LIMITED CODED SEQUENCES WITH MAXIMUM TRANSITION DENSITY CONSTRAINTS

FIELD OF THE INVENTION

This invention relates to anomalous decoding of sequences of binary values such as may be found in magnetic storage recording channels or in optical communications subsystems where the errors, erasures, or faults involve binary subsequences exhibiting high-duty-cycle patterns or selected pattern repetitions. More particularly, the invention relates to methods and means for either preventing indefinite repetition of the patterns or excluding them.

DESCRIPTION OF RELATED ART

It is well known that a binary-valued sequence, such as 1000011011, may be adversely interpreted by decoding devices due to unintended patterns or attributes present in such sequences. For example, a sequence such as 1010101010 . . . exhibits a very high duty cycle. Electronically, a high duty cycle is synonymous with electrical or mechanical elements being repeatedly stressed. This frequently results in attendant thermal and noise increases in component environments resulting in higher error rates, failure rates, and shortened component lives.

The term "duty cycle" for purposes of this specification means the number of binary 1's occurring in a pattern or repetitive subsequence interval. In the 101010 example, the duty cycle is 50 percent since the "1" occurs in every two-bit interval. If the repetitive pattern was of the form of two binary 4-bit words such as 1001, 1000, the duty cycle would be $3/8 = 37.5$ percent.

In magnetic recording channels and optical communications there arises the phenomenon of pulse smearing or broadening. For instance, two binary 4-bit words 0001, 0010 might, as a result of "smearing", appear at the input of the decoder as 0001, 1010. In this case, the binary 1 in the $4^{th}$-bit position of the first word is electrically or optically "stretched" to appear as if it were two consecutive binary 1's. Such studies or smearing is especially egregious in pulse position modulation (PM) communications systems or the like. This devolves from the fact that PPM systems are notoriously bandwidth inefficient.

It is known from Adler et al., U.S. Pat. No. 4,413,251, "Method and Apparatus for Generating a Noiseless Sliding Block Code for a (1,7) Channel with Rate 2/3", issued Nov. 1, 1983, that a finite state machine (FSM) can convert unconstrained binary-valued sequences into a constrained binary-valued sequence in an invertible manner. Furthermore, Adler teaches that a finite lookahead state-independent machine could perform the decoding. The lookahead capability permits a decoder to resolve n<m bits of a current RLL codeword into m bits of the unconstrained sequence by taking into account a predetermined number of subsequent RLL codewords. Nevertheless, this decoder lookahead feature increases the adverse effect of error or erasure in the RLL codeword.

According to Adler et al., for a given code rate R=m/n of mapping m bits of unconstrained binary sequence into n bits of constrained sequence, the requirement is partially satisfied by deriving an FSM encoder with $2^m$ branches per state in which the (d, k) constraints are manifested by splitting and merging some of the FSM states in order to obtain a new FSM. The (d, k) constraint means that at least d "0's" and no more than k "0's" are to be inserted between any pair of consecutive binary "1's". For d<k, d determines the frequency of transitions and whence the intersymbol interference (ISI). In the case of k, it is used for clock resynchronization.

SUMMARY OF THE INVENTION

It is accordingly an object of this invention to devise an invertible method and apparatus for converting unconstrained sequences of binary values into a fixed-rate RLL-coded sequence either inhibiting indefinite repetition of or excluding RLL subsequences exhibiting high-duty-cycle patterns.

It is yet another object of this invention that such invertible method and apparatus generate RLL-coded sequences with good bandwidth efficiency, minimal ISI, low complexity, and exhibit sufficient timing information for clock recovery.

The foregoing objects are satisfied by an FSM for converting an unconstrained sequence of binary values into a constrained sequence selected from one of a set of fixed-rate $2/3$ (d, k) RLL codes consisting of (1,9) and (1,13) RLL codes in which predetermined RLL-coded sequences are inhibited from indefinite recurrence, as in the case of (1,9) and (1,10) RLL codes, or excluded from appearing, as in the case of the (1,13) RLL code. Furthermore, a lookahead nonstate-dependent decoder provides for the necessary invertability when the RLL-coded sequences are read from a storage subsystem or an optical communications path or the like.

More particularly, the foregoing objects are believed satisfied by a processor implementable method or a hardwired combinatorial logic equivalent for invertibly mapping binary sequences into rate $2/3$ (1, k) run-length-limited coded (RLL) sequences with maximum transition density constraints. The method involves two steps, namely, defining and storing a finite state machine operative as an encoder and then executing the mapping over the binary sequences.

The first step involves defining and storing in a processor a state transition table of ordered pairs including a next state $(n_1 n_2 n_3)$ and a current RLL-coded tri-bit symbol $(c_1 c_2 c_3)$. Each ordered pair in said table is indexed in a first tabular dimension according to its present state, and in a second tabular dimension according to a vector $(b_1 b_2 b_3 b_4)$ of a present $(b_1 b_2)$ and a predetermined number of lookahead $(b_3 b_4)$ bit-pairs from the binary sequence. Each present bit-pair is a cognizable binary value (00,01,10,11). Also, each of the predetermined numbers of bit-pairs is selected from a set consisting of a cognizable binary value and a "don't care" (xx) value. Significantly, the state-to-state transitions are constrained such that any counterpart long-run sequence of RLL-coded tri-bits manifests a duty cycle less than 50 percent. The second step involves causing the processor to access the table responsive to a succession of vectors of bit-pairs and extending therefrom a succession of RLL-coded tri-bits. The logical relations defining the binary-to-RLL codeword mappings and their inverses are elaborated in the figures and in the description of the preferred embodiment.

In order to use a (1, k) rate $2/3$ RLL encoding to reduce the duty cycle of a stream of binary values, it was necessary to appreciate the effect it would have when selected unconstrained binary-coded patterns were applied to a standard (1,7) or (1,9) rate $2/3$ RLL encoder. Indeed, these selected patterns produced constrained binary-coded patterns with very high duty cycles. These are exemplified in Table 1 below:

TABLE 1

| Unconstrained Binary-coded Patterns | | Duty Cycle |
|---|---|---|
| (1,7) Rate 2/3 RLL Code | | |
| 00 11 00 | 010 101 010 | 4/9 |
| 00 11 01 | 010 101 001 | 419 |
| (1,7), (1,9) Rate 2/3 RLL Codes | | |
| 10 11 00 | 100 101 010 | 4/9 |
| 10 11 01 | 100 101 001 | 419 |
| (1,7), (1,9) Rate 2/3 RLL Codes | | |
| 00 11 10 11 | 010 101 000 101 | 5/12 |
| 10 11 10 11 | 100 101 000 101 | 5/12 |

However, it was further observed that (1,9) and (1,13) rate 2/3 RLL encoders of the type disclosed in the Adler '413 patent could be heuristically modified to either (a) inhibit indefinite high-duty-cycle RLL encoding repetitions of these predetermined unconstrained patterns, or (b) effectively inhibit them such as is shown in Table 2 below:

TABLE 2

| Unconstrained Binary-coded Patterns | |
|---|---|
| | (1,9) Rate 2/3 RLL with Modified Encoder/Decoder |
| 00 11 00 | 010 000 000 |
| 00 11 01 | 001 000 000 |
| | (1,13) Rate 2/3 RLL with Modified Encoder/Decoder |
| 10 11 00 | 100 000 000 |
| 10 11 01 | 101 000 000 |
| 00 11 10 11 | 010 000 000 000 |
| 10 11 10 11 | 100 000 000 000 |

BRIEF DESCRIPTION OF THE DRAWING

FIGS. 4A–4C respectively illustrative a state transition table for a (1,9) rate 2/3 RLL encoder modified according to the invention, Boolean equations relating to the unconstrained inputs to the constrained outputs, and a high-level logic gate embodiment of the encoder.

FIGS. 5A–5C respectively show a decoding table for a (1,9) rate 2/3 RLL decoder modified according to the invention, Boolean equations relating constrained inputs to unconstrained outputs, and a high-level logic gate embodiment of the decoder.

FIGS. 6A–6C respectively depict Boolean equations relating unconstrained inputs to constrained outputs for a (1,13) rate 2/3 RLL encoder modified according to the invention, a state transition table, and a high-level logic gate embodiment of the encoder.

FIGS. 7A–7C respectively set out a decoding table for a (1,13) rate 2/3 RLL decoder modified according to the invention, Boolean equations relating constrained inputs to unconstrained outputs, and a high-level logic gate embodiment of the decoder.

DESCRIPTION OF THE PREFERRED EMBODIMENT

Figure 1:
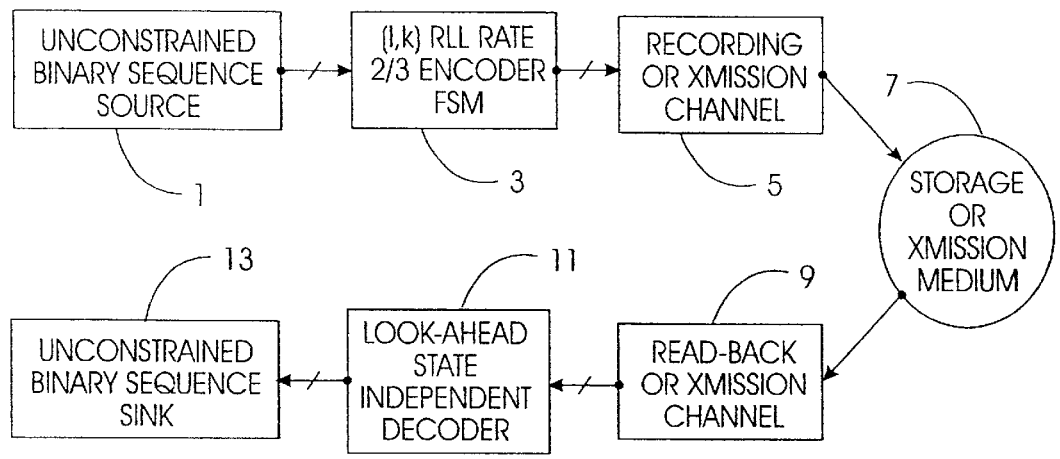
FIG. 1 shows a constrained channel encoder and decoder positioned with respect to an information storage or transfer medium according to the invention.

Referring now to FIG. 1, there is shown a constrained channel encoder 3 positioned before a recording or transmission channel 5 and an information storage or transfer medium 7. A counterpart decoder 11 is positioned between a readback or reception channel 9 and unconstrained binary sequence sink 13. The binary source 1 can be conceived as a random number generator of 1's and 0's having a uniform, Gaussian, or other statistical distribution and exhibiting from time to time repetition patterns having high duty cycles. These cycles range from 50 percent at the highest in the form of 10101010 . . . etc. to sequences with more tolerable duty cycles significantly less than 50 percent. Since the general solution is to apply the unconstrained binary sequence to a (1, k) rate 2/3 RLL encoder, the encoder itself provides a duty cycle minimum The constrained binary output strings from encoder 3 is in turn applied to a recording or transmission channel 5 where it is suitably modulated and written out to either a storage or transmission medium 7. At a subsequent time, the constrained and modulated string is applied to a readback or reception channel 9 and converted into a constrained binary string of 1's and 0's. This converted binary string is then applied to a lookahead state-independent decoder 11. The decoder 11 utilizes a predetermined number of subsequent characters (lookahead) and removes the constraints, thereby providing the original unconstrained binary sequence to a sink 13.

Figure 2:
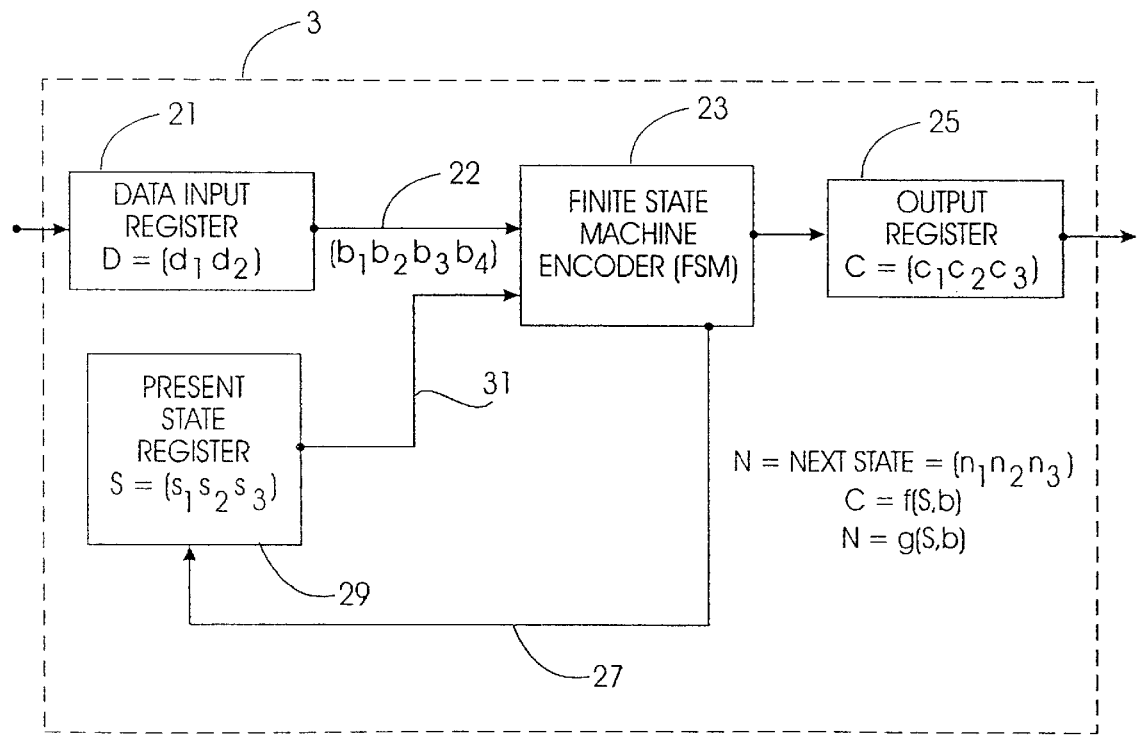
FIG. 2 sets out a finite state machine (FSM) for use as an encoder illustrating the output as a function of the present internal state and a set of inputs, and the next internal state as another function of the present internal state and a set of inputs.

Referring now to FIG. 2, there is shown a finite state machine (FSM) for use as an encoder 3. For a specific set of parameters of $(d, k)=(1,9)$ or $(1,13)$, a predetermined number of present input bits $(b_1 b_2)$ and future input bits $(b_3 b_4)$ are applied $(b_1 b_2 b_3 b_4)$ from an input register 21 to an FSM 23 over path 22. The FSM 23 provides an output to register 25. An output set of binary bits $C=(c_1 c_2 c_3)$ is derived as a function $f$ of input bits $(b_1 b_2 b_3 b_4)$ and present machine state $S=(s_1 s_2 s_3)$. Concurrently, the next machine state N is determined as a function g of input bits $(b_1 b_2 b_3 b_4)$ and present machine state S. Thus, for the next cycle, next machine state N is written into the present state register 29 and becomes the new present machine state S. In this regard, an FSM can also be conceptualized as a form of directed graph whose nodes represent the FSM machine states S, and whose directed links define the state-to-state transitions for any given input vector while generating a counterpart output vector. The tabular form of the directed graph is termed a "state transition table".

Figure 3:
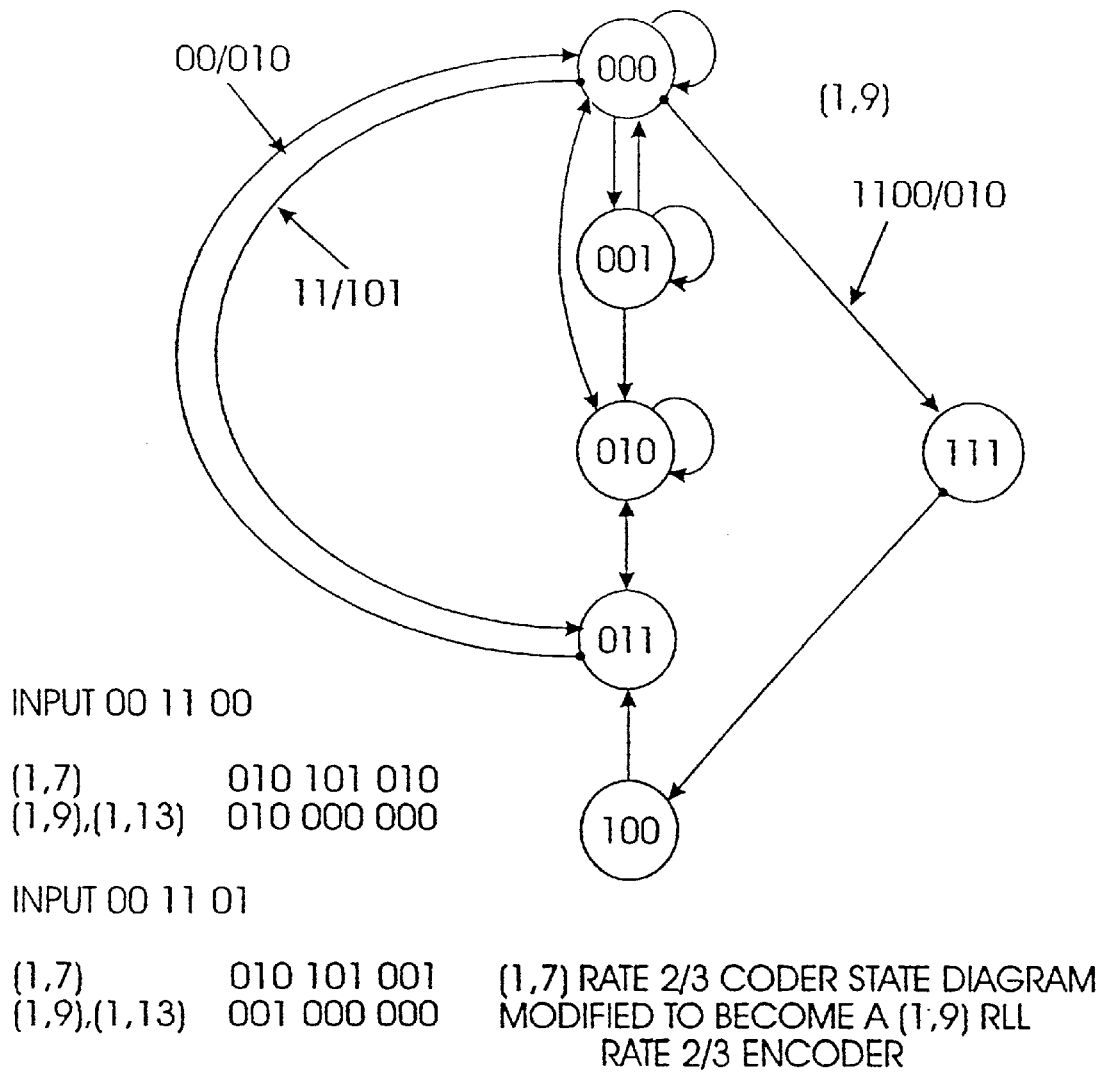
FIG. 3 depicts a state diagram (1,7) rate 2/3 RLL encoder responsive to an unconstrained binary input producing a high-duty-cycle output where a state modification transforms the encoder to a (1,9) rate 2/3 RLL encoder producing a low-duty-cycle output.

Referring now to FIG. 3, there is depicted a partial-state diagram or directed graph of a (1,7) rate 2/3 RLL encoder responsive to an unconstrained binary input producing a high-duty-cycle output. Nodes 000, 001, 010, 011, and 100 represent the internal states of the (1,7) encoder. Since this is a rate 2/3 encoder, then for an input pattern of two bits at a time of 00 11 00, the encoder output pattern would be three bits at a time of 010 101 010. Similarly, for the input pattern 00 11 01, the output pattern would be 010 101 001. If an additional state 111 is added to the state diagram and connected between states 000 and 100 as shown, the encoder is converted to (d, k)=(1,9) rate ⅔ encoder. The additional state provides sufficient computational resource to lookahead over several input symbols and generates an output sequence of lowered duty cycle, namely, 010 000 000 for input 00 11 00 and 001 000 000 for input 00 11 01.

Figure 4C:
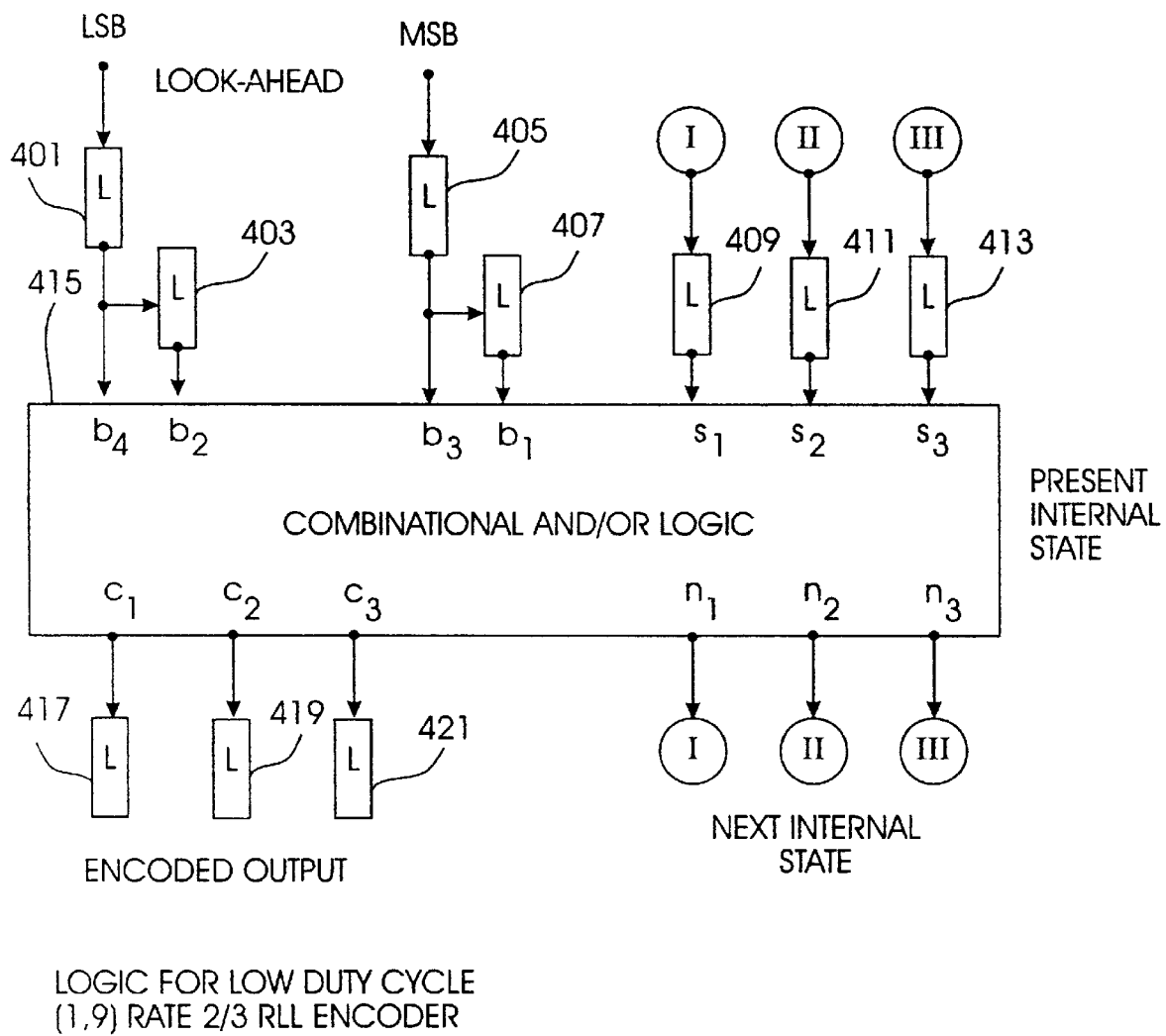

Referring now to FIGS. 4A–4C, there is respectively shown a state transition table for a (1,9) rate ⅔ RLL encoder modified according to the invention, Boolean equations relating unconstrained binary inputs to highly constrained binary outputs, and a high-level logic gate embodiment of the encoder. In FIG. 4A, the encoder is an FSM having six internal states S. While the encoder is rate ⅔, it is designed to be responsive to a present input bit-pair plus one lookahead input bit-pair b=($b_1 b_2 b_3 b_4$). Each row is indexed by one of the six internal states S, while each column is indexed by one of seven inputs of two bit-pair combinations. For any given (S, b) table index, the entry is of the form (next state N/Output C=($c_1 c_2 c_3$)). Of seven input two-bit-pair input combinations, three of them, namely, 00 xx, 01 xx, and 10 xx, have two "don't care" bit-valued positions. Illustratively, if the (1,9) encoder wherein state 100 in the input was 00 xx, then a transfer would be made from state 100 to state 000 and output C=000 would be generated.

Referring now to FIG. 4B, there is set out Boolean equations defining the next state Boolean function N=($n_1 n_2 n_3$)=g(S, b) and the output Boolean function C=($c_1 c_2 c_3$)=f (S, b). These equations are analytic expressions derived from the state transition table in FIG. 4A. In these Boolean expressions, the negation of a Boolean variable C is signified by "C". Thus, the negation of 111 would be exemplified by '(111). It should be noted that the Boolean equations in FIG. 4B completely specify the combinatorial AND/OR logic 415.

Relatedly, logic for a low-duty-cycle (1,9) rate ⅔ RLL encoder is shown in FIG. 4C. In the logic embodiment, a present input bit-pair ($b_1 b_3$) is applied via latches 407 and 403 to combinatorial logic 415. Similarly, a lookahead input bit-pair ($b_3 b_4$) is applied to logic 415 via latches 405 and 401. The encoded output C is presented by logic 415 to latches 417, 419, and 421. The next internal state N is presented by logic 415 over feedback paths I, II, and m to respective input latches 409, 411, and 413.

Figure 5C:
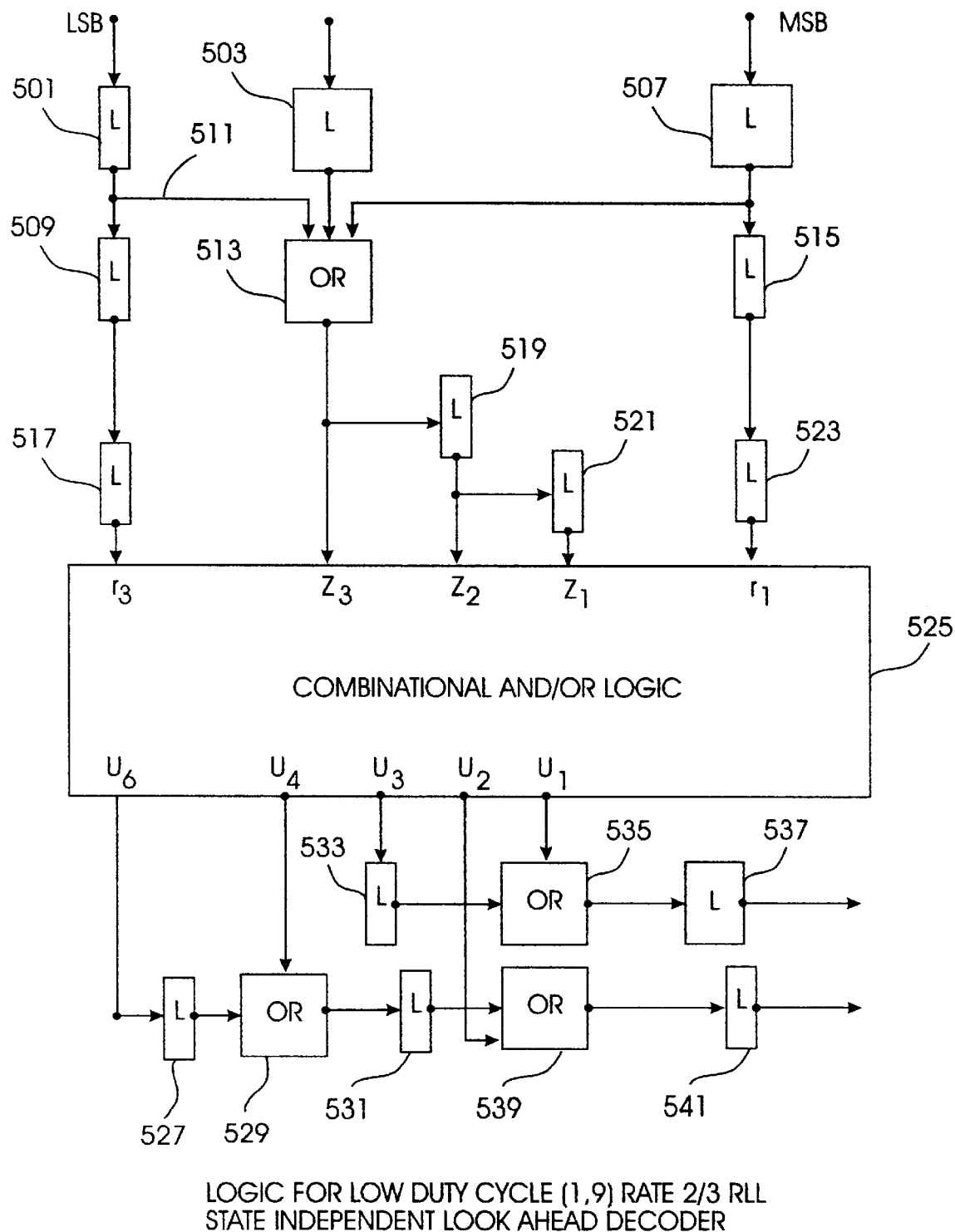

Referring now to FIGS. 5A–5C, there is respectively shown a decoding table for a (1,9) rate ⅔ RLL decoder modified according to the invention, Boolean equations relating constrained inputs back into unconstrained outputs, and a high-level logic gate embodiment of the decoder. In FIG. 5A, the decoding table while providing for lookahead over several RLL symbols is state independent. That is, it does not constitute an FSM in the sense of an encoder. The RLL binary-coded symbols designate the first three columns from left to right. These include a present symbol ($r_1 r_2 r_3$) and two lookahead symbols ($r_4 r_5 r_6$) and ($r_7 r_8 r_9$). The fourth column is designated as the "Decoded Output". For decoding purposes, the RLL symbol string comprises a sliding block of 3-bit symbols in which decoding of the present symbol occurs as the result of logically combining the present symbol with two lookahead symbols according to the Boolean equations set out in FIG. 5B.

Referring now to FIG. 5C, each RLL-coded symbol comprises a 3-bit byte, which bits are respectively applied to latches 501, 503, and 507. The bits are processed to form three intermediate internal variables $z_1$, $z_2$, and $z_3$ via OR gate 513 and latches 519 and 521. These are applied concurrently as inputs to the combinatorial logic 525.

Additionally, the first and third bit values $r_1$ and $r_3$ of the present RLL-coded symbol are passed by way of respective latches 509, 517, 515, and 523 as concurred inputs to the logic 525.

Logic 525 is completely defined by the logic equations for the decoded output expressed in FIG. 5B. While the logic equations prescribed a 6-coded bit output ($u_1 u_2 u_3 u_4 u_5 u_6$), the output variable u, is set equal to 0. In the embodiment shown, additional logic is provided to convert decoded output U into the 2-bit bytes of the original unconstrained binary sequence. Thus, a first one of the 2-bit bytes is computed by OR gate 529 actively combining $u_4$ and a version of $u_6$ as found in latch 527 and OR gate 539 actively combining OR gate 529 output as found in latch 531 and the $u_2$ output from logic 525. A second one of the 2-bit bytes is computed by OR gate 535 actively combining $u_1$ and a version of $u_3$ as found in latch 533. The first one of the two bits is presented through latch 541, while the second one of the two bits is presented through latch 537.

Figure 6C:
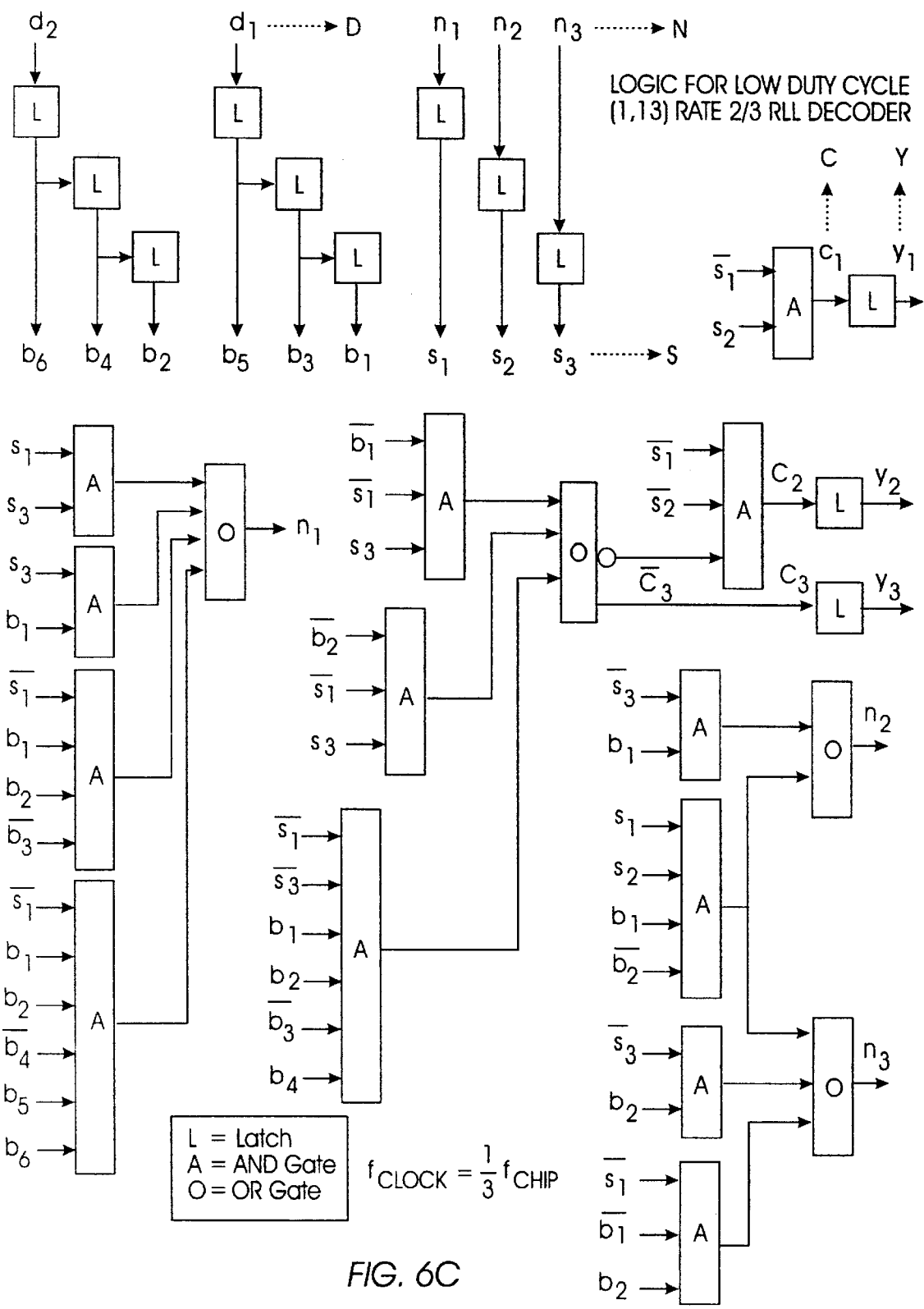

Referring now to FIGS. 6A–6C, there is respectively depicted the state transition table for a (1,13) rate ⅔ RLL encoder modified according to the invention, Boolean equations relating unconstrained inputs to constrained outputs, and a high-level logic gate embodiment of the encoder. Turning attention to FIG. 6B, there is shown the state transition diagram in the form of an array of ordered pairs of internal states and coded output as indexed by a present internal state S and a compound input ($b_1 b_2 b_3 b_4 b_5 b_6$). The compound input in the case of a (1,13) encoder is a present coded binary input bit-pair and two of the lookahead coded binary input bit-pairs. If the encoder were subject to a continuous input of 00 xx xx, then it would ultimately transit to state 000 and cycle within the state producing a 010010010010 . . . output for a duty cycle of ⅓. This is still substantially less than one-half associated with the output 010101 . . . .

The Boolean equations for the (1,13) encoder shown in FIG. 6A are very similar in gross structure to the equations set out for the (1,9) encoder as shown in FIG. 4B. That is, they are derived from the state transition diagram and are constrained to produce a low duty cycle of output. The equations also articulate an alternative representation for negation through the use of a horizontal bar above the Boolean variable.

Referring now to FIG. 6C, there is shown a logical embodiment of the (1,13) encoder equivalent to that of the logical embodiment of the (1,9) encoder shown in FIG. 4C, with the exception that the (1,13) encoder is depicted in detached contact form. Detached contact form was originally devised to represent relay circuit networks as used, for example, in the telephone industry. Three input bit-pair's $d_1 d_2$ are applied to the latches L, the input bits $b_1$ . . . $b_6$ together with the internal state are applied to the combinatorial logic in a manner substantially similar to that described in connection with the (1,9) encoder.

Figure 7C:
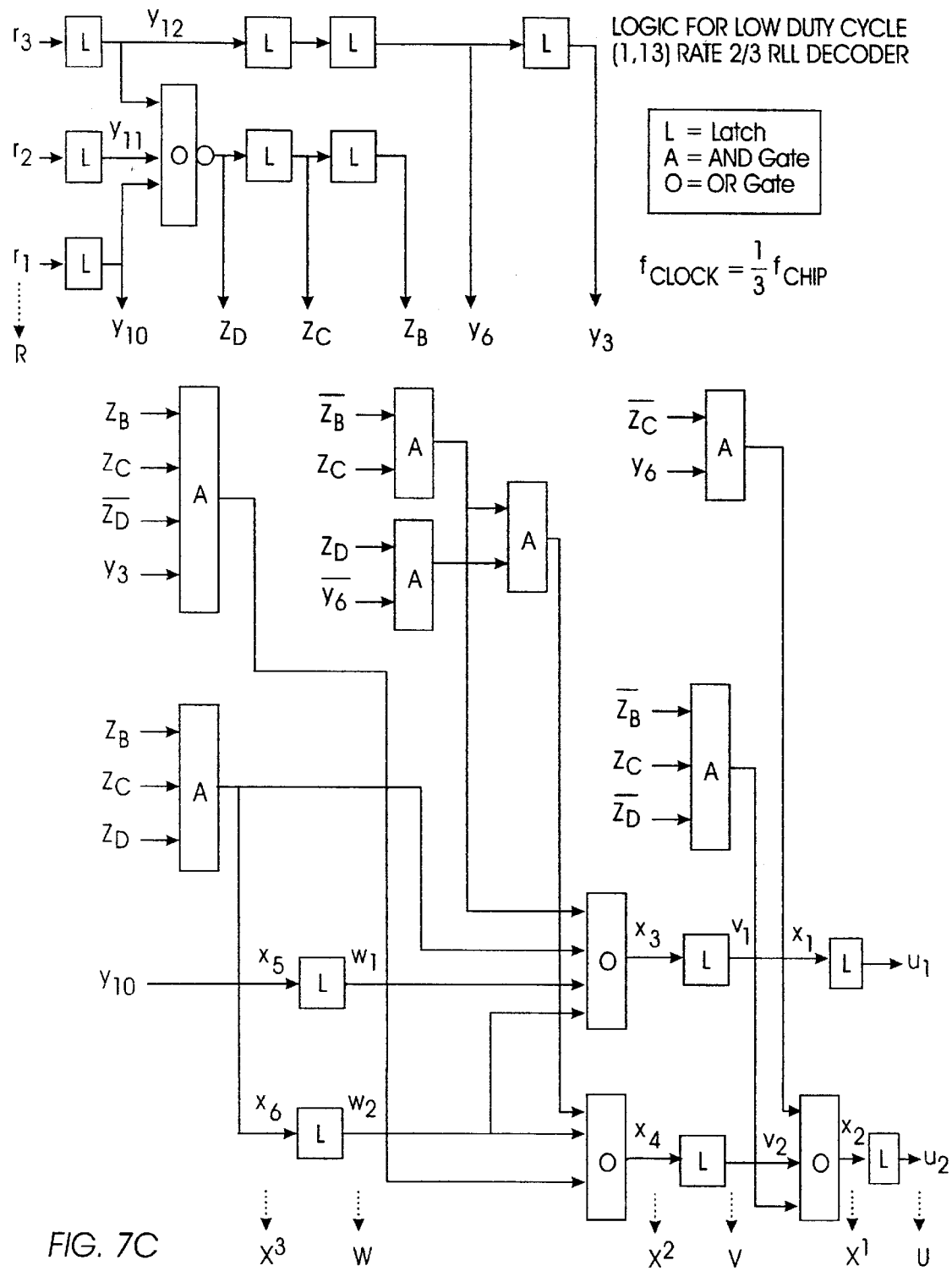

Referring now to FIGS. 7A–7C, there is respectively set out a decoding table for a (1,13) rate ⅔ RLL decoder according to the invention, Boolean equations relating constrained inputs to unconstrained outputs, and a high-level logic embodiment of the decoder. In FIG. 7A, a state-independent decoding table is set out involving a present RLL symbol and three lookahead RLL symbols in order to effectuate mapping the present RLL symbol into unconstrained binary bit-pair sequences. Relatedly, Boolean logic equations defining the decoder are set out in FIG. 7B and the detached contact logic embodiment in FIG. 7C, and operating in a manner as previously described in connection with the embodiment set up in FIG. 4C.

While the invention has been described with respect to an illustrative embodiment thereof, it will be understood that various changes may be made in the method and means herein described without departing from the scope and teaching of the invention. Accordingly, the described embodiment is to be considered merely exemplary and the invention is not to be limited except as specified in the attached claims.

What is claimed is:

1. A processor implementable method for invertibly mapping binary sequences into rate ⅔ (1, k) run-length-limited coded (RLL) sequences with maximum transition density constraints comprising the steps of:

(a) defining and storing in a processor a state transition table of ordered pairs including a next state ($n_1n_2n_3$) and a current RLL-coded tri-bit symbol ($c_1c_2c_3$), each ordered pair in said table being indexed in a first tabular dimension according to its present state and in a second tabular dimension according to a vector ($b_1b_2b_3b_4$) of a present ($b_1b_2$) and a predetermined number of lookahead ($b_3b_4$) bit-pairs from the binary sequence, each present bit-pair being a cognizable binary value (00, 01, 10, 11), each of the predetermined number of lookahead bit-pairs being selected from a set consisting of a cognizable binary value and a don't care (xx) value, the state-to-state transitions being constrained such that any counterpart long-run sequence of RLL-coded tri-bits manifests a duty cycle less than 50 percent; and (b) causing said processor to access the table responsive to a succession of vectors of bit-pairs and extracting therefrom a succession of RLL-coded tri-bits.

2. The method according to claim 1, wherein said method comprises the steps of:

(c) defining and storing in said processor a state-independent decoding table comprising a list of binary sequence bit-pairs indexed by a vector formed from a present RLL-coded tri-bit and a predetermined number of lookahead RLL-coded tri-bits; and (d) causing said processor to access said decoding table responsive to a succession of RLL-coded tri-bit vectors and extracting therefrom a succession of binary sequence bit-pairs.

3. The method according to claim 2, wherein said (1, k) RLL code constraints are ones selected from a set consisting of (1,9) and (1,13).

4. The method according to claim 1, wherein said duty cycle substantially approximates one-third, and further wherein said (1, k) RLL code constraints are ones selected from a set consisting of (1,9), (1,10) and (1,13).

5. An arrangement for invertibly mapping binary sequences into rate ⅔ (1,9) run-length-limited coded (RLL) sequences with maximum transition density constraints comprising:

a finite state machine (FSM) for generating RLL-coded tri-bit symbols ($c_1c_2c_3$) as a first function of a present one of a plurality of FSM internal states ($s_1s_2s_3$) and a vector ($b_1b_2b_3b_4$) of a present ($b_1b_2$) and a predetermined number of lookahead ($b_3b_4$) bit-pairs from the binary sequence and for generating a next successor internal machine state ($n_1n_2n_3$) as a second function of the present FSM state and the binary sequence vector, each present bit-pair being a cognizable binary value (00, 01, 10, 11), each of the predetermined number of lookahead bit-pairs being selected from a set consisting of a cognizable binary value and a don't care (xx) value, said first and second functions being defined according to a plurality of Boolean valued relations such that:

$n_1 = b_1S_3 + b_1b_2'b_3's_1's_2 + s_1s_3$
   $n_2 = b_1's_3$
   $n_3 = b_2's_3 + 's_1'b_1b_2$
   $c_1 = 's_1s_2$
   $c_2 = 's_1's_2'c_3$
   $c_3 = 's_1s_3('b_1 + 'b_2) + 's_1's_2's_3b_1b_2'b_3b_4$.

6. The arrangement according to claim 5, said arrangement further comprising:

logic circuits responsive to a succession of RLL-coded tri-bit vectors for extracting therefrom a succession of binary sequence bit-pairs, each RLL-coded tri-bit vector being formed from a present RLL-coded tri-bit ($r_1r_2r_3$) and a predetermined number of lookahead RLL-coded tri-bits ($r_4 \ldots r_9$), said logic circuits including first circuits for forming first Boolean variables ($z_1z_2z_3$), second circuits for forming second Boolean variables ($U_1U_2 \ldots U_6$), and third circuits for deriving binary sequence bit-pairs as a function of the second Boolean variables;

said first circuits being defined according to a plurality of Boolean-valued relation such that $z_1 = '(r_1+r_2+r_3)$, $z_2 = '(r_4+r_5+r_6)$, $z_3 = '(r_7+r_8+r_9)$; and said second circuits being defined according to a plurality of Boolean-valued relation such that:

$U_1 = r_1$
   $U_2 = ('z_2)r_3 + 'z_1z_2'z_3$
   $U_3 = 'z_1z_2$
   $U_4 = z_2z_3 + 'z_1z_2'r_3$
   $U_5 = 0$
   $U_6 = z_2z_3r_3$.

7. An arrangement for invertibly mapping binary sequences into rate ⅔ (1,13) run-length-limited coded (RLL) sequences with maximum transition density constraints comprising:

a finite state machine (FSM) for generating RLL-coded tri-bit symbols ($c_1c_2c_3$) as a first function of a present one of a plurality of FSM internal states ($s_1s_2s_3$) and a vector ($b_1b_2b_3b_4b_5b_6$) of a present ($b_1b_2$) and a predetermined number of lookahead ($b_3b_4b_5b_6$) bit-pairs from the binary sequence and for generating a next successor internal machine state ($n_1n_2n_3$) as a second function of the present FSM state and the binary sequence vector, each present bit-pair being a cognizable binary value (00, 01, 10, 11), each of the predetermined number of lookahead bit-pairs being selected from a set consisting of a cognizable binary value and a don't care (xx) value, said first and second functions being defined according to a plurality of Boolean-valued relations such that:

$n1 = (s_1s_3) + (s_3b_1) + ('s_1b_1b_2'b_3) + ('s_1b_1b_2'b_4b_5b_6)$
   $n_2 = ('s_3b_1) + (s_1s_2b_1'b_2)$
   $n_3 = ('s_3b_2) + ('s_1'b_1b_2) + (s_1s_2b_1'b_2)$
   $c_1 = ('s_1s_2)$
   $c_2 = ('s_1's_2'c_3)$
   $c_3 = 's_1s_3('b_1 + 'b_2) + ('s_1's_3b_1b_2'b_3b_4)$.

8. An article of manufacture comprising a machine-readable memory having stored therein a plurality of processor executable control program steps for invertibly mapping binary sequences into rate ⅔ (1, k) run-length-limited coded (RLL) sequences with maximum transition density constraints, said control program steps include:

(a) a control program step for defining and for storing in a processor a state transition table of ordered pairs including a next state ($n_1n_2n_3$) and a current RLL-coded tri-bit symbol ($c_1c_2c_3$), each ordered pair in said table being indexed in a first tabular dimension according to its next state and in a second tabular dimension according to a vector ($b_1b_2b_3b_4$) of a present ($b_1b_2$) and a predetermined number of lookahead ($b_3b_4$) bit-pairs from the binary sequence, each present bit-pair being a cognizable binary value (00, 01, 10, 11), each of the predetermined number of lookahead bit-pairs being selected from a set consisting of a cognizable binary value and a don't care (xx) value, the state-to-state transitions being constrained such that any counterpart long-run sequence of RLL-coded ti-bits manifests a duty cycle less than 50 percent; and (b) a control program step operative for causing said processor to access the table responsive to a succession of vectors of bit-pairs and for extracting therefrom a succession of RLL-coded tri-bits.

* * * * *